United States Patent
Olewine et al.

(10) Patent No.: US 8,178,404 B2
(45) Date of Patent: May 15, 2012

(54) METAL-INSULATOR-METAL (MIM) CAPACITOR STRUCTURE AND METHODS OF FABRICATING SAME

(75) Inventors: Michael Olewine, Albuquerque, NM (US); Kevin Saiz, Albuquerque, NM (US)

(73) Assignee: NXP B.V., Eindhoven (NL)

( * ) Notice: Subject to any disclaimer, the term of this patent is extended or adjusted under 35 U.S.C. 154(b) by 95 days.

(21) Appl. No.: 12/257,582

(22) Filed: Oct. 24, 2008

(65) Prior Publication Data

US 2009/0267184 A1  Oct. 29, 2009

Related U.S. Application Data

(62) Division of application No. 09/973,640, filed on Oct. 9, 2001, now Pat. No. 6,717,193, and a division of application No. 11/445,841, filed on May 30, 2006, now Pat. No. 7,456,072, which is a division of application No. 10/788,057, filed on Feb. 25, 2004, now Pat. No. 7,084,042, which is a division of application No. 09/973,640, filed on Oct. 9, 2001, now Pat. No. 6,717,193.

(51) Int. Cl.
*H01L 21/8242* (2006.01)

(52) U.S. Cl. ........ 438/240; 438/239; 438/381; 438/393; 438/396; 438/398; 257/306; 257/309; 257/310; 257/532; 257/534; 257/E21.008; 257/E21.009; 257/E21.011; 257/E27.087; 257/E29.343; 361/306.3

(58) Field of Classification Search .......... 438/239, 438/240, 381, 393, 396, 398; 257/306, 309, 257/310, 532, 534, E21.008, E21.009, E21.011, 257/E27.087, E29.343; 361/306.3
See application file for complete search history.

(56) References Cited

U.S. PATENT DOCUMENTS 4,453,199 A  6/1984 Ritchie et al.
(Continued)

FOREIGN PATENT DOCUMENTS

JP  62293751 A  12/1987
(Continued)

OTHER PUBLICATIONS

"http://www.ece.umd.edu/class/enee416.F2009/GroupActivities/Report6.pdf", Edwin Perez and Edward Leong.*
(Continued)

*Primary Examiner* — Dao H Nguyen

(57) ABSTRACT

A Metal-Insulator-Metal (MIM) capacitor structure and method of fabricating the same in an integrated circuit improve capacitance density in a MIM capacitor structure by utilizing a sidewall spacer extending along a channel defined between a pair of legs that define portions of the MIM capacitor structure. Each of the legs includes top and bottom electrodes and an insulator layer interposed therebetween, as well as a sidewall that faces the channel. The sidewall spacer incorporates a conductive layer and an insulator layer interposed between the conductive layer and the sidewall of one of the legs, and the conductive layer of the sidewall spacer is physically separated from the top electrode of the MIM capacitor structure. In addition, the bottom electrode of a MIM capacitor structure may be ammonia plasma treated prior to deposition of an insulator layer thereover to reduce oxidation of the electrode. Furthermore, a multi-rate etching process may be used to etch the top electrode and insulator layer of an MIM structure, using a first, higher rate to perform an anisotropic etch up to a point proximate an interface between the conductive and dielectric materials respectively defining the top electrode and insulator layer of the MIM structure, and then using a second, lower rate to perform an anisotropic etch to a point proximate an etch stop layer defined on the bottom electrode of the MIM structure.

21 Claims, 8 Drawing Sheets

U.S. PATENT DOCUMENTS

| | | | |
|---|---|---|---|
| 4,866,502 | A | 9/1989 | Tomaszewski et al. |
| 5,583,359 | A | 12/1996 | Ng et al. |
| 5,696,394 | A | 12/1997 | Jones, Jr. et al. |
| 5,700,731 | A | 12/1997 | Lin et al. |
| 5,780,115 | A | 7/1998 | Park et al. |
| 5,866,453 | A | 2/1999 | Prall et al. |
| 5,872,697 | A | 2/1999 | Christensen et al. |
| 5,895,239 | A | 4/1999 | Jeng et al. |
| 5,926,359 | A | 7/1999 | Greco et al. |
| 5,939,766 | A | 8/1999 | Stolmeijer et al. |
| 6,080,617 | A * | 6/2000 | Fujii et al. ............... 438/240 |
| 6,091,599 | A | 7/2000 | Amamiya |
| 6,177,305 | B1 | 1/2001 | Hornback et al. |
| 6,180,976 | B1 | 1/2001 | Roy |
| 6,200,629 | B1 | 3/2001 | Sun |
| 6,232,197 | B1 | 5/2001 | Tsai |
| 6,238,964 | B1 | 5/2001 | Cho |
| 6,251,740 | B1 | 6/2001 | Johnson et al. |
| 6,259,128 | B1 | 7/2001 | Adler et al. |
| 6,285,050 | B1 | 9/2001 | Emma et al. |
| 6,342,734 | B1 | 1/2002 | Allman et al. |
| 6,385,033 | B1 | 5/2002 | Javanifard et al. |
| 6,455,419 | B1 | 9/2002 | Konecni et al. |
| 6,461,914 | B1 * | 10/2002 | Roberts et al. ............ 438/253 |
| 6,479,343 | B1 * | 11/2002 | Hwang et al. ............ 438/253 |
| 6,479,850 | B2 | 11/2002 | Lee |
| 6,551,896 | B2 | 4/2003 | Hosoda et al. |
| 6,740,553 | B1 * | 5/2004 | Lee et al. ............ 438/240 |
| 6,770,525 | B2 * | 8/2004 | Lee et al. ............ 438/239 |
| 7,084,042 | B2 * | 8/2006 | Olewine et al. ............ 438/396 |
| 7,456,072 | B2 * | 11/2008 | Olewine et al. ............ 438/381 |
| 2002/0160577 | A1 | 10/2002 | Hosoda et al. |
| 2002/0163025 | A1 * | 11/2002 | Vaartstra et al. ............ 257/295 |
| 2003/0013007 | A1 | 1/2003 | Kaun |

FOREIGN PATENT DOCUMENTS

| | | |
|---|---|---|
| JP | 63285964 A | 11/1988 |
| JP | 10178109 A | 6/1998 |
| JP | 2001-144252 A | 5/2001 |
| JP | 2001-177057 A | 6/2001 |
| JP | 2007078890 A | 3/2007 |
| TW | 494559 B | 7/2002 |

OTHER PUBLICATIONS

Lopez-Dekker, Francisco J., "Three Dimensional Electromagnetic Field Simulation of Integrated Metal-insulator-Metal Capacitors", Master Thesis, University of California, Irvine (1998).

Edwin Perez and Edward Leong, "Group Activity 6 Report", (2009).

* cited by examiner

METAL-INSULATOR-METAL (MIM) CAPACITOR STRUCTURE AND METHODS OF FABRICATING SAME

CROSS REFERENCE TO RELATED APPLICATIONS

This is a divisional of application Ser. No. 09/973,640 filed on Oct. 9, 2001

FIELD OF THE INVENTION

The invention is generally related to integrated circuit fabrication, and more particularly, to the fabrication of metal-insulator-metal (MIM) capacitor structures in integrated circuits.

BACKGROUND OF THE INVENTION

Reduced circuit area is an economic driver of the microelectronics revolution. Integrated circuits, or chips, continue to increase in circuit density due to reduced sizes of circuit components made possible through the implementation of smaller and smaller circuit design rules. As more and more components are designed into an integrated circuit, the complexity of the integrated circuit is increased, thereby enabling greater functionality in the circuit. Moreover, functions that were once performed by multiple integrated circuits can often be integrated together onto the same integrated circuit, thereby reducing costs, power consumption, and size, while improving speed and interconnectivity.

In addition, other components such as capacitors, inductors, resistors, and other types of passive components are increasingly integrated into integrated circuits, thereby eliminating the need to incorporate separate, discrete components in a circuit design that otherwise increase circuit size, power consumption and cost. Both the demands of smaller circuit design rules, and the desire to incorporate various passive circuit components in an integrated circuit, however, has demanded new materials, new structures and new processing techniques to be incorporated into the integrated circuit fabrication process.

One type of passive component that is increasingly incorporated into many integrated circuit designs is a metal-insulator-metal (MIM) capacitor, which typically incorporates a stacked arrangement of materials that includes, in the least, top and bottom conductive electrodes incorporating a conductive material, and an intermediate insulator layer incorporating a dielectric material. Typically, a MIM capacitor is fabricated between the outermost metal layers in an integrated circuit (e.g., between the M5 and M6 layers), which orients the capacitor relatively far from the underlying semiconductor substrate, such that parasitic capacitance effects with the substrate are minimized.

MIM capacitors are often utilized, for example, in high frequency (e.g., RF) telecommunications applications such as in cell phones and other wireless devices, as well as other telecommunications products. Often, MIM capacitors are used to provide various functions in an integrated circuit, e.g., decoupling with a power supply, analog functions such as analog-to-digital conversions and filtering, and termination of transmission lines. Decoupling applications generally have relatively loose leakage current requirements, whereas analog applications, such as analog-to-digital converters (ADC's), typically require closer capacitor matching and relatively good voltage linearity. Moreover, in many telecommunications applications, particularly in handheld applications, low loss and relatively small temperature linearity are desired.

Given the ever-present desire to reduce the sizes of components in an integrated circuit, it is desirable to minimize the circuit area occupied by MIM capacitors. To provide a desired capacitance from a MIM capacitor within a smaller circuit area, therefore, an increase in the capacitance density of the capacitor (which based upon present design rules is typically expressed in terms of femtofarads per square micrometer ($fF/\mu m^2$)) is required.

Conventional approaches to increasing MIM capacitor capacitance density have typically focused upon using high dielectric constant (K) dielectric materials in the insulator layer of a MIM capacitor, decreasing insulator layer thickness and/or utilizing structure geometries that increase perimeter (which increases fringe and lateral capacitance effects).

For example, high dielectric constant materials such as tantalum pentoxide, tantalum oxynitride, silicon nitride, barium strontium titanate (BST), lead zirconium titanate, and hafnium oxide have been used in some conventional MIM capacitor designs. Furthermore, various process improvements have been utilized to deposit such materials with reduced thicknesses, and without inducing short circuits between the electrodes of the capacitor design.

In addition, some MIM capacitor designs have relied upon multiple "fingers" forming one of the electrodes of a design. The multiple fingers extend generally parallel one another and incorporate an increased perimeter compared to a single contiguous electrode occupying the same circuit area.

Nonetheless, despite the improvements made in conventional MIM capacitor designs, many such designs are limited to at most about 1 $fF/\mu m^2$. At this density, however, capacitors providing the necessary capacitance for many applications (e.g., many RF applications) are inordinately large, particularly for more advanced design rules. As an example, at 1 $fF/\mu m^2$, a 100 nF capacitor would require a circuit area of approximately 1 cm per side, which, when used in connection with technology such as a 0.25 μm RF BiCMOS technology, results in a width that is approximately 40,000 times the minimum feature size for the integrated circuit.

Therefore, a significant need continues to exist in the art for a manner of improving the capacitance density in a MIM capacitor structure.

Another difficulty experienced in connection with MIM capacitor fabrication is oxidation of the bottom electrode during fabrication. Particularly when electrode materials such as titanium nitride (TiN) are used, oxidation of the electrode prior to deposition of the insulator layer can occur and form titanium oxides that cause current leakage. Prior attempts to inhibit oxidation include, for example, depositing the insulator layer in the same tool in which the electrode material is deposited. However, by depositing both layers in the same tool, patterning and etching of both layers must generally occur together, requiring the insulator layer to have the same layout as the bottom electrode. Furthermore, close coupling of the bottom electrode and dielectric film depositions does not guarantee a clean interface between the materials.

Therefore, a significant need also exists in the art for a manner of inhibiting the formation of oxidation on a bottom electrode of a MIM capacitor structure.

Yet another difficulty experienced in connection with MIM capacitor fabrication is that of patterning and etching the MIM capacitor structure in connection with aluminum-based circuit interconnects. In particular, whenever aluminum or aluminum alloy interconnects, as are commonly used in the metal layers of an integrated circuit, are exposed to etching chemistry such as $CCl_4$, $BCl_3$, $Cl_2$, etc., aluminum chloride is often generated as a byproduct thereof, necessitating the use of an additional aluminum polymer removal step to clean the partially-fabricated integrated circuit. Adding such a step increases processing time and expense, and may not remove all chlorine (Cl) containing compounds that can cause Al corrosion.

Therefore, a significant need also exists in the art for a manner of etching a MIM capacitor structure without undue exposure of aluminum interconnects to chlorine chemistry.

SUMMARY OF THE INVENTION

The invention addresses these and other problems associated with the prior art by providing in one aspect a Metal-Insulator-Metal (MIM) capacitor structure and method of fabricating the same in an integrated circuit in which a sidewall spacer extends along a channel defined between a pair of legs that define portions of the MIM capacitor structure. Each of the legs includes top and bottom electrodes and an insulator layer interposed therebetween, as well as a sidewall that faces the channel. The sidewall spacer incorporates a conductive layer and an insulator layer interposed between the conductive layer and the sidewall of one of the legs, and the conductive layer of the sidewall spacer is physically separated from the top electrode of the MIM capacitor structure. By orienting a sidewall spacer, with a conductive layer that is physically separated from a top electrode, along the channel, it has been found that lateral capacitance effects between the pair of legs that face the channel are substantially increased, resulting in substantial improvements in overall capacitance density for the MIM capacitor structure.

While other manners of fabricating a sidewall spacer may be used consistent with the invention, one suitable manner includes forming first and second bottom electrodes that extend generally parallel to one another and defining a channel therebetween, depositing an insulator layer over the first and second bottom electrodes and in the channel, depositing a conductive layer over the insulator layer, and etching the deposited conductive and insulator layers. Etching these layers results in the definition of first and second top electrodes that oppose the first and second bottom electrodes, as well as a physical separation between a portion of the conductive layer in the channel and the first and second top electrodes.

The invention also addresses in another aspect a number of improvements to the process of making MIM capacitor structures. For example, one aspect of the invention addresses the difficulties associated with oxidation of the bottom electrode of a MIM capacitor structure by providing a MIM capacitor structure and method of fabricating the same in an integrated circuit in which a surface of the bottom electrode is ammonia plasma treated. As another example, another aspect of the invention addresses the difficulties associated with the exposure of aluminum interconnects to etching chemistry, by utilizing a multi-rate etching process to etch the top electrode and insulator layer of an MIM structure, using a first, higher rate to perform an anisotropic etch up to a point proximate an interface between the conductive and dielectric materials respectively defining the top electrode and insulator layer of the MIM structure, and then using a second, lower rate to perform an anisotropic etch to a point proximate an etch stop layer defined on the bottom electrode of the MIM structure. Through the use of an etch stop layer, underlying aluminum interconnects are protected from undue exposure to etching chemistry, thus eliminating in many instances the need for the aluminum polymer removal and related cleaning processes.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments of the invention described hereinafter utilize several structural and process improvements to improve the capacitance density of a Metal-Insulator-Metal (MIM) capacitor structure in a fabricated integrated circuit. These structural and process improvements are generally compatible with conventional integrated circuit fabrication processes, dimensions and process equipment, thus providing improved MIM capacitor performance with minimal additional manufacturing steps and/or costs. For example, it is believed that the invention permits capacitor structures having picofarad-range capacitances to be incorporated into otherwise standard integrated circuits and fabrication processes.

From a structural standpoint, the combination of a high dielectric constant material used for the insulator layer of the MIM capacitor structure, and a layout that attempts to maximize the perimeter-to-area ratio of the structure (and thus maximize fringe capacitance effects), provides substantially improved capacitance density over many conventional MIM structures. Moreover, the layout is further configured to provide recessed channels that run between opposing legs of the structure, so that one or more sidewall spacers, having conductive material that is physically separated from the top electrode of the MIM structure by a high K dielectric constant material, can be formed within the channels to further improve lateral capacitance effects, and thus further improve the capacitance density of the MIM structure.

From a process standpoint, ammonia plasma treatment may be utilized on the bottom electrode of a MIM structure to improve the barrier characteristic of the surface of the bottom electrode to oxygen, thereby inhibiting oxidation of the bottom electrode prior to deposition of the insulator layer. Moreover, a multi-rate etching process may be utilized to etch the top electrode and insulator layer of an MIM structure, using a first, higher rate to perform an anisotropic etch up to a point proximate an interface between the conductive and dielectric materials respectively defining the top electrode and insulator layer of the MIM structure, and then using a second, lower rate to perform an anisotropic etch to a point proximate an etch stop layer defined on the bottom electrode of the MIM structure.

Figure 1:
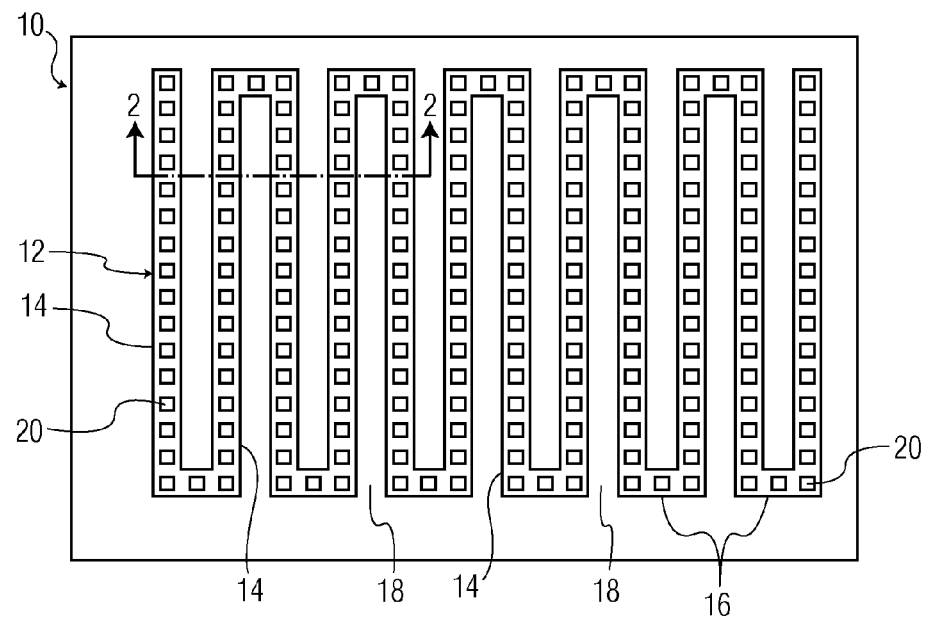
FIG. 1 is a schematic top plan view of an integrated circuit incorporating an exemplary Metal-Insulator-Metal (MIM) capacitor structure consistent with the invention.

Turning to the drawings, wherein like numbers denote like parts throughout the several views, FIG. 1 illustrates an integrated circuit 10 incorporating a MIM capacitor structure 12 consistent with the principles of the invention. Structure 12 is implemented using a serpentine layout that incorporates a plurality of leg portions or legs 14 laid out in a generally parallel relationship to one another, and coupled together by bridge portions 16 proximate the ends of each pair of legs. Each pair of adjacent legs 14 defines a recessed channel 18 therebetween. Moreover, an array of vias 20 are disposed over much of the surface area of the structure to provide interconnection with an upper interconnect layer (not shown in FIG. 1), e.g., the M6 layer when the capacitor structure is formed between the M5 and M6 layers of an integrated circuit. It will be appreciated that various via layouts, spacings and geometries, as well as other inter-layer interconnects, may be utilized to interconnect the MIM capacitor structure with a conductive layer (e.g., any of the interconnect layers Mx) in integrated circuit 12.

Figure 2:
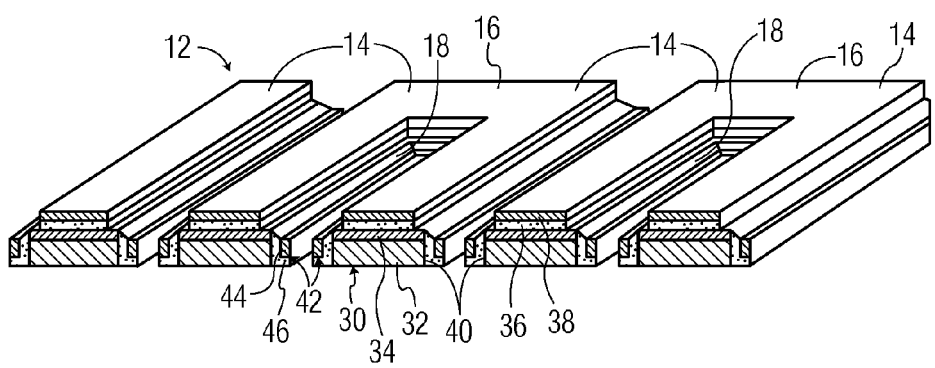
FIG. 2 is an isometric cross-sectional view of the MIM capacitor structure of FIG. 1, taken through lines 2-2 thereof, and with the vias.

Turning next to FIG. 2, the basic capacitive structure of each leg 14 in MIM capacitor structure 12 is illustrated in greater detail. In particular, each leg 14 includes a bottom electrode 30 formed primarily of a block of conductive material 32 such as aluminum, copper or an alloy thereof, and coated with a conductive layer 34 that functions in the illustrated embodiment as both an anti-reflection coating (ARC) and an etch stop layer for subsequent etching processes.

In the illustrated embodiment, for example, the MIM capacitor structure is described as being formed between the M5 and M6 layers in a six metal layer integrated circuit, whereby conductive material 32 is deposited and patterned during deposition and patterning of the M5 layer in the circuit. By orienting the structure in the outermost layers of the circuit, parasitic capacitance effects with the substrate are minimized, and the quality factor of the capacitor is improved. Moreover, by using a low K dielectric beneath the MIM capacitor structure, substrate parasitic effects are further reduced. However, it will be appreciated that a MIM capacitor structure consistent with the invention may be fabricated within and between various other interconnect layers within an integrated circuit consistent with the invention.

Layered over bottom electrode 30 is an insulator layer 36, formed of a dielectric material such as tantalum pentoxide ($Ta_2O_5$). Layered over insulator layer 36 is a conductive layer 38 forming the top electrode for the MIM capacitor structure. As will be discussed below, insulator layer 36 and top electrode 38 may be cooperatively patterned during an etching process, and as a result, typically these two layers will have the same geometric proportions in many implementations.

As also shown in FIG. 2, each leg 14 of MIM capacitor structure 12 that runs adjacent another leg 14 and forms a channel 18 therebetween has a sidewall 40 that faces the channel. Given the typical thickness of the M5 layer as compared to each of layers 34, 36 and 38, nearly all of the sidewall 40 is defined along layer 32, and the height of the sidewall is principally controlled by the thickness of the M5 layer.

Also positioned within each channel 18 are one or more sidewall spacers 42 that extend generally parallel to the sidewalls 40 of the legs 14 in structure 12. Each sidewall spacer 42 includes a conductive layer 44 and an insulator layer 46 interposed between layer 44 and sidewall 40 of an adjacent leg 14. As will become more apparent below, conductive layer 44 is typically deposited concurrently with conductive layer 38, and insulator layer 46 is deposited concurrently with insulator layer 36, with generally the same thicknesses. Other manners of forming the sidewall spacers may be used in the alternative, e.g., separate using deposition steps, technologies, and/or materials than are used for layers 36 and 38.

Conductive layer 44 in each sidewall spacer 46 is physically separated from the top electrode of the MIM capacitor structure, i.e., there is no direct conductive path between the two components. The only electrical coupling between the components is via capacitive effects. In the illustrated embodiment, there is a physical separation between layer 44 and bottom electrode 30 (and hence, between layer 44 and the M5 layer), although in other embodiments a direct conductive path may be provided between these components.

Typically a sidewall spacer is provided alongside each sidewall facing a channel defined between adjacent legs in a MIM capacitor structure, although only one sidewall spacer may be used in some embodiments. Furthermore, each sidewall spacer typically runs along the entire length of each channel, although embodiments may be envisioned where sidewall spacers are only provided along a portion of a given channel, as well as only in a portion of all channels, defined in a MIM capacitor structure.

Each sidewall spacer functions to increase both the fringe and lateral components of capacitance for the MIM capacitor structure, by increasing the dielectric constant of the material between the legs of the serpentine. Moreover, as will be discussed in greater detail below, it has been found that capacitance density increases as the sidewall (and hence, the sidewall spacer) height is likewise increased.

It is believed that, with the necessary limitations on the minimum separations between legs, the lateral components of capacitance are predominantly affected by the presence of the sidewall spacers. Accordingly, it is further believed that increases in capacitance via the sidewall spacers are predominantly realized through increasing the dielectric constant between the legs, which is obtained by increasing the dielectric constant of the deposited material, and increasing the height of the sidewalls (and thus the height of the spacers). It is also believed that, in some embodiments, sidewall spacers may not require any conductive material, such that, with the herein-described process, a separate etching step could be used to remove the conductive material used in the sidewall spacers. For other processes, the sidewall spacers may be formed separately from the deposition and etching steps that form the insulator layer and top electrode for the MIM capacitor structure, and as such, various techniques could be used to inhibit the deposition of conductive material for the sidewall spacers during deposition of the top electrode material.

Figure 3:
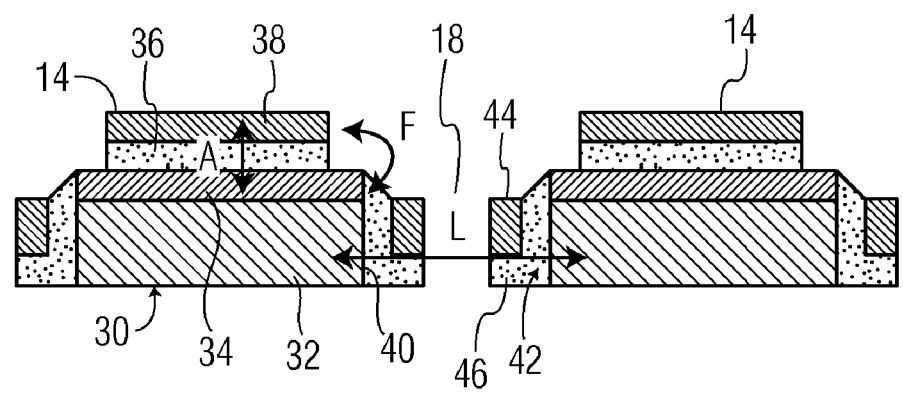
FIG. 3 is an enlarged cross-sectional view of two legs in the MIM capacitor structure of FIG. 2, illustrating the capacitance components therefor.

As shown in FIG. 3, for example, the principal components affecting the capacitance density of the herein-described MIM capacitor structures are areal capacitance, fringe capacitance, and lateral capacitance, denoted respectively by the labels A, F and L. Areal capacitance is principally affected by the dielectric constant, area and thickness of the insulator layer, while fringe capacitance is principally affected by the perimeter of the layout. Lateral capacitance is based upon the capacitive coupling between adjacent legs in the layout, and it is believed that the incorporation of sidewall spacers enhances both the fringe and lateral capacitive components for a MIM capacitor structure.

In the illustrated embodiment of FIGS. 1-3, where a 0.25 μm BiCMOS technology is used, the insulator layer and the TiN top electrode have minimum dimensions of about 5 μm spacing and about 2 μm width in each leg, while the bottom electrode is slightly oversized relative to the top electrode and insulator layer, e.g., the MIM top electrode is about 1 μm inbound from the edge of the M5 bottom electrode, with minimum dimensions of about 3 μm spacing and about 4 μm width in each leg, thereby defining channels of about 3 μm in width between adjacent legs. The vias interconnecting the MIM capacitor structure to the next metal layer (e.g. M6) may have a pitch of about 4 μm diameter of about 2 μm when formed from hot aluminum, and a pitch of about 3 μm and a diameter of about 1 μm when formed from tungsten. Larger dimensions may be used, although typically the perimeter-to-area ratio of the resulting structure will decrease, and result in less lateral and fringe components to the overall capacitance of the structure.

Also, in the illustrated embodiment described above, the insulator layer is formed of a high K dielectric such as silicon nitride, titanium dioxide, tantalum pentoxide, barium strontium titanate (BST), lead zirconium titanate, hafnium oxide, tantalum oxynitride, etc., having a thickness of as little as about 80 angstroms, which is often limited by the defectivity of the layer itself and the underlying layers. A thickness of about 400-500 angstroms has been found to give a capacitance density of about 5 fF/μm$^2$, while thinner layers provide comparatively greater capacitance density. While thicker insulator layers may be used, often the capacitance density is lowered below desirable levels. In the implementation discussed hereinafter, a tantalum pentoxide ($Ta_2O_5$) insulator layer is used, although other high K dielectrics, as well as lower K dielectrics, may be used in other implementations.

The top electrode may be formed of about 3000 angstroms of TiN, but is typically limited only by the overetch of the V5 dielectric etch. For example, if the selectivity of the oxide etch is such that about 750 angstroms of TiN is consumed, then an about 1500 to about 2000 angstrom TiN top electrode thickness will typically be sufficient in many applications. By using a 3000 angstrom thickness, the Al—Cu or Ti/TiN liner (in the case of W plugs) may be kept a sufficient distance from the top electrode/insulator layer interface, and thereby minimize the possibility of reaction between these layers at an elevated temperature.

The bottom electrode may be formed of a TiN anti-reflective coating (ARC) layer deposited on the M5 layer (typically formed of aluminum, copper, or an alloy thereof, depending upon the IC fabrication technology used). Typically, the thickness of the TiN layer is set by the patterning requirements of the M5 layer; however, a minimum of about 250 to 300 angstroms is typically desired to reduce or eliminate reflections during the subsequent patterning process, which otherwise might cause notches to form in the photoresist material. Thicker TiN layers may be used, however, and may have advantages in the throughput of the multi-rate etch process described in greater detail below. For the M5 portion of the bottom electrode, a thickness of about 1 μm to about 4 μm may be used, although thinner layers, e.g., about 5000-7000 angstroms may be used as well. As will become more apparent below, by increasing the M5 layer thickness, the fringe component of the capacitance is typically increased. However, the maximum thickness will typically depend upon the ability of the film deposition tool to fill high aspect ratio features such as the channels between the bottom electrode portions in adjacent legs of the MIM capacitor structure. For example, many such tools are limited to a height-to-width ratio of about 3.5:1.

Other materials may be utilized in the top and bottom electrodes, e.g., various metals and silicides of tungsten (W), titanium (Ti), tantalum (Ta), manganese (Mn), molybdenum (Mo), etc. In addition, a material such as ruthenium may be used as a barrier layer over TiN to prevent oxidation of the TiN layer.

It will be appreciated that, depending upon the capabilities of various fabrication technologies that may be utilized in the fabrication of integrated circuits, the dimensions, thicknesses, and materials utilized in an MIM capacitor structure may vary in other implementations. Therefore, the invention is not limited to the particular dimensions, thicknesses, and materials described herein. Moreover, it will be appreciated that the relatively layer thicknesses and dimensions shown in the figures are not necessarily true to scale, as the relative thicknesses of some layers (e.g., the TiN layers and the insulator layers, which are often several orders of magnitude thinner than the M5 layer) have been exaggerated to facilitate a better understanding of the overall structure of a MIM capacitor consistent with the invention. Therefore, the invention is not limited by the particular thicknesses illustrated in the figures.

Figure 4:
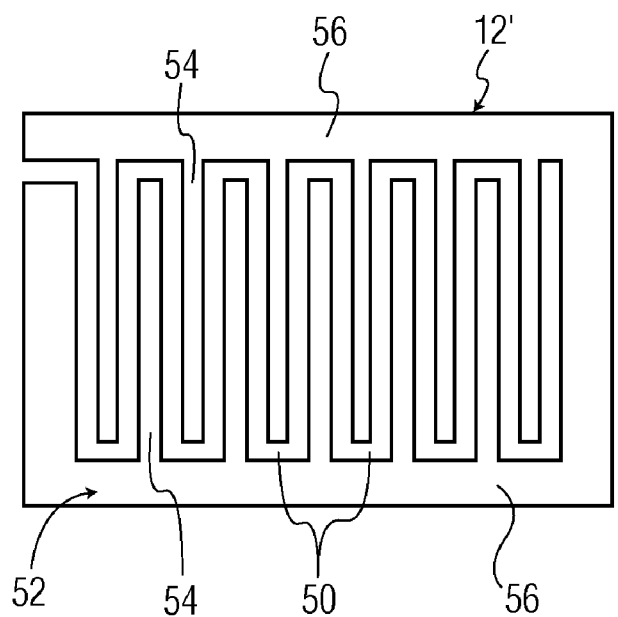
FIG. 4 is a schematic top plan view of an alternate MIM capacitor structure layout to that of FIG. 1.

Returning to FIG. 1, any number of legs and lengths of legs may be used in a serpentine capacitor layout consistent with the invention. Moreover, it will be appreciated that a wide variety of alternate capacitor layouts may be utilized in the alternative, in particular, various layouts that maximize the perimeter-to-area ratio of a structure. As one example, FIG. 4 illustrates a MIM capacitor structure 12' incorporating a "negative serpentine" layout, where a channel 50, rather than the capacitive structure 52, forms a serpentine design. With the negative serpentine layout, the capacitive structure 52 is defined by an interleaved comb pattern, where legs 54 alternately extend inward from a pair of opposing rails 56.

Figure 10:
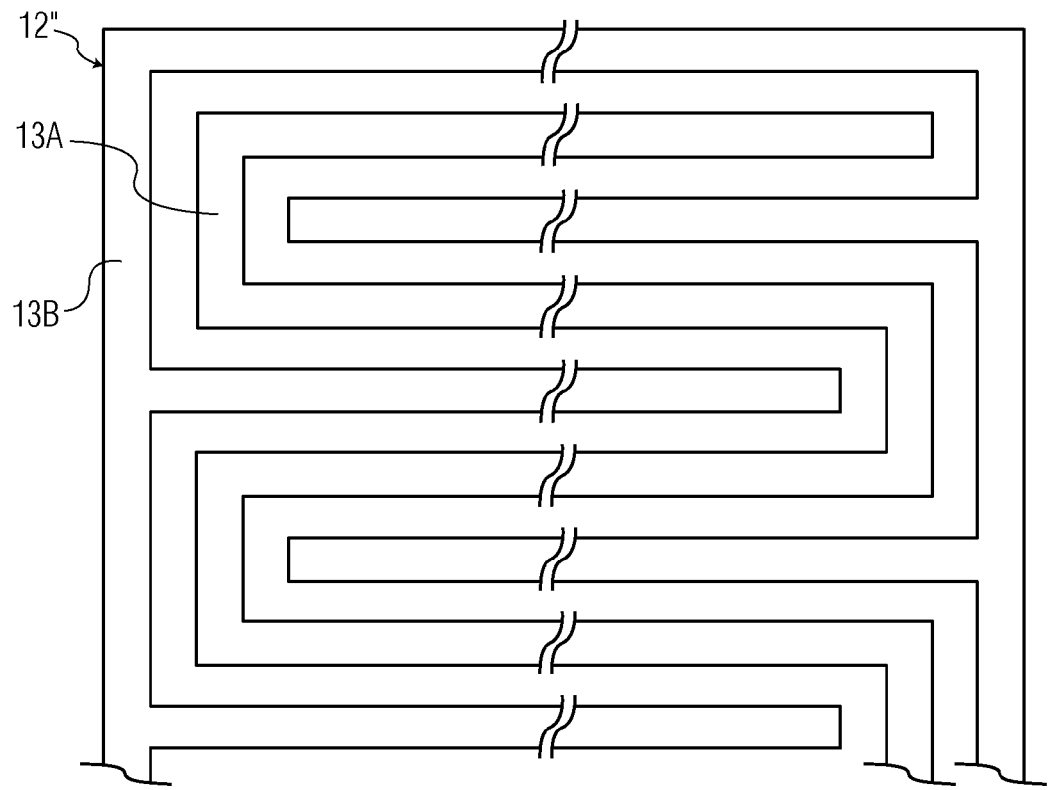
FIGS. 10-13 are schematic top plan views of additional alternate MIM capacitor structure layouts to that of FIG. 1.

In addition, it should be appreciated that patterns can be combined. As an example, FIG. 10 illustrates an exemplary layout 12" which is in many respects similar to the combination of layouts 12 and 12', where a positive serpentine pattern 13A is essentially embedded within the channel defined in an interleaved comb, or negative serpentine, pattern 13B, such that the positive and negative serpentine patterns are interleaved with one another. Given the ability to use via connections to other layers (e.g., M6), FIG. 10 also illustrates that the electrodes of a capacitor structure need not necessarily be contiguous throughout the electrode layers.

Figure 11:
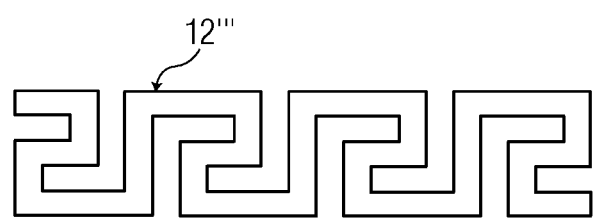
Figure 12:
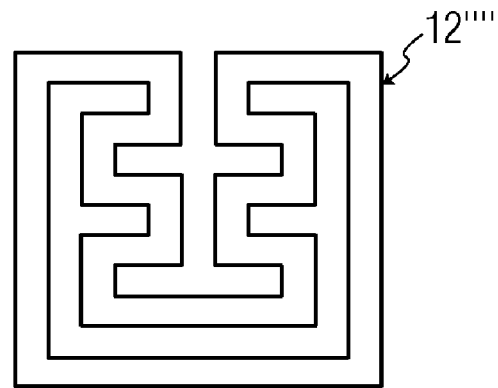
Figure 13:
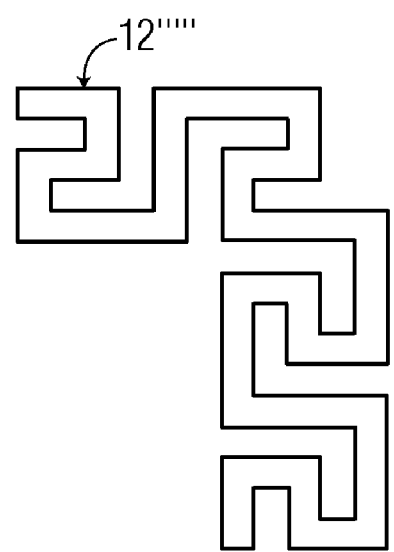

Many other suitable designs utilizing high perimeter-to-area ratios will be appreciated by one of ordinary skill in the art having the benefit of the instant disclosure, e.g., various tiled serpentine and/or comb patterns, spiral patterns, and combinations thereof. As an example, FIGS. 11-13 illustrate several exemplary layouts 12''', 12'''' and 12''''', also suitable for incorporation into a MIM capacitor structure consistent with the invention. Both positive and negative layouts based upon these patterns may be suitable for use, as may various combinations of the repeating elements in these patterns.

Figure 5:
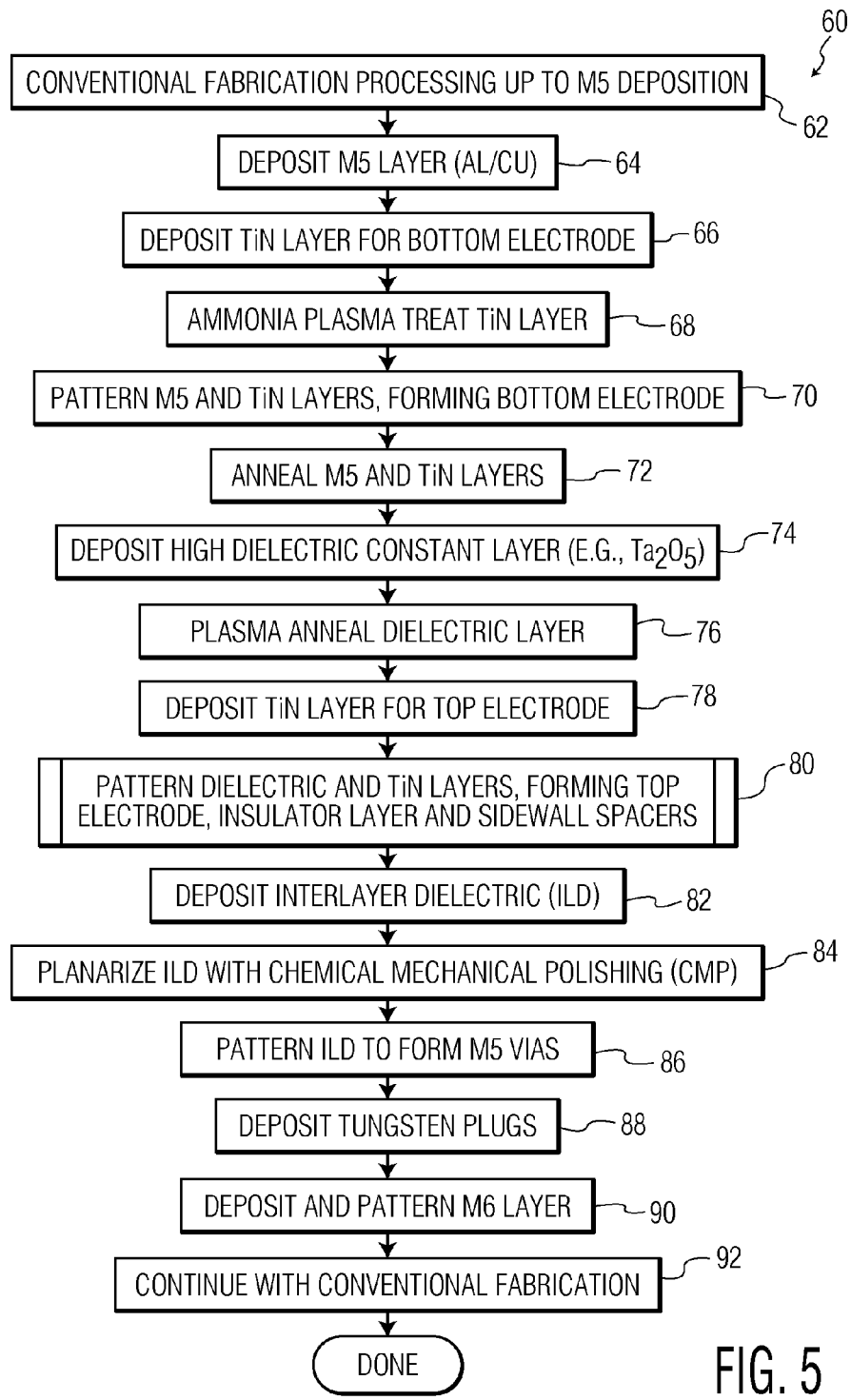
FIG. 5 is a flowchart illustrating a process for fabricating the integrated circuit of FIG. 1.

Now turning to FIG. 5, an exemplary process for fabricating an integrated circuit that incorporates a MIM capacitor structure consistent with the invention is illustrated at 60, and begins at block 62 by performing conventional fabrication processing up to the point of M5 deposition, e.g., using a 0.25 μm BiCMOS process technology. Next, as shown in blocks 64 and 66, the conductive material for the M5 layer, e.g., an aluminum-copper alloy such 0.5% by weight of copper in a balance of aluminum, is deposited on the integrated circuit, followed by deposition of a thin (e.g., about 300 angstrom) coating of titanium nitride (TiN), e.g., via reactive physical vapor deposition (PVD), otherwise known as sputtering. The Al—Cu deposition process desirably uses a lower deposition temperature (e.g., about 200° C.) to produce a smooth fine grained material. It has been found that high temperatures during sputtering can cause the incorporation of contaminants in the growing film, which can lead to the formation of surface protrusions known as hillocks. The capacitor dielectric can often break down at these protrusions due to high electric field intensity, thereby causing a short circuit.

As discussed above, the thickness of the M5 stack (the aluminum-copper and TiN layers) directly affects the lateral capacitance effects between adjacent legs of the design, and as such, a relatively thick M5 layer, e.g., 2 μm or more, may be desirable in many embodiments.

Next, as illustrated in block 68, an ammonia plasma treatment step is performed to treat the exposed surface of the TiN layer to reduce or eliminate oxidation of the surface prior to and during deposition of the insulation layer of the capacitor. In particular, it has been found that performing an ammonia plasma treatment serves to bombard the surface of the TiN layer with nitrogen ions to "stuff" the columnar grain boundaries in the TiN structure and thereby reduce the formation of titanium oxide (TiO) on the surface of the TiN layer.

In the illustrated embodiment, a multi-station plasma enhanced chemical vapor deposition (PECVD) tool may be used to generate an ammonia plasma. The process may use a silicon nitride process as a starting point, by removing the silane flow and using a total RF power (about 13.56 MHz) of about 0.1 to 1 Watts/cm$^2$, with up to about 50% low frequency RF (about 230 kHz) power. The plasma anneal may include an ammonia (NH$_3$)/inert gas (e.g., N$_2$ or Ar) mixture in a plasma discharge, and in an atmosphere at about 10 mTorr to 10 Torr pressure. The flowrates of the ammonia and inert gas are typically set to the levels that achieve the best uniform growth of silicon nitride on a silicon test wafer substrate. The wafer temperature during the treatment may be held at a level of about 300-500° C., which is compatible with aluminum processing, and the treatment time may be approximately the same as that required to form a silicon nitride film of less than 100 angstroms on a silicon substrate.

Figure 6A:
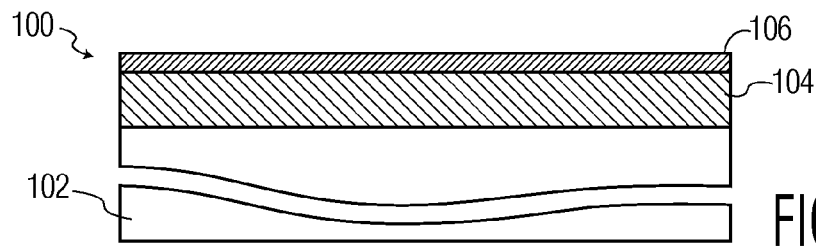
FIGS. 6A-6G are schematic cross-sectional views illustrating fabrication of a MIM capacitor structure using the process of FIG. 5.

Turning briefly to FIG. 6A, an exemplary integrated circuit 100 is shown subsequent to the processes performed in blocks 62-66 of FIG. 5. At 102 is illustrated the semiconductor substrate, including all of the integrated circuit components up to the M5 layer. An aluminum-copper layer deposited in block 64 is represented at 104, and an ammonia plasma treated TiN layer, deposited in block 66, and ammonia plasma treated in block 68, is represented at 106.

Figure 6B:
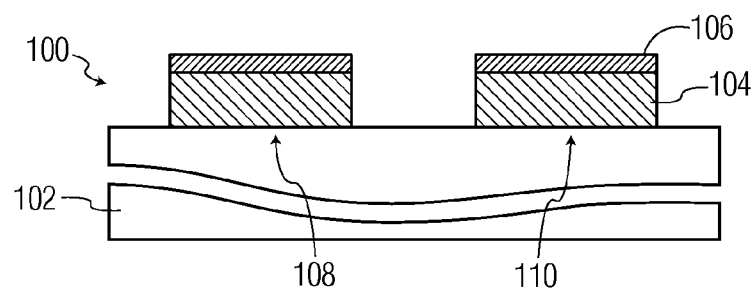

Returning to FIG. 5, after ammonia plasma treatment, the M5 stack is patterned by conventional lithography and etch techniques to form the bottom electrode for the MIM capacitor structure (block 70). As discussed above, the presence of the TiN layer serves as an anti-reflective coating that minimizes reflections of the exposure light that could otherwise cause overexposure of areas of the photoresist pattern and result in loss of pattern transfer fidelity such as due to unintended notching of photoresist lines. The resulting patterned structure is illustrated in FIG. 6B. For illustrative purposes, FIG. 6B illustrates the patterning of the M5 stack into a bottom electrode 108 and an M5 bonding pad 110.

Next, in block 72 (FIG. 5) an annealing step is performed to anneal the M5 and TiN layers in a reducing atmosphere to relive stress in the metal layer. For example, a heat treatment at about 420° C. for about 30 minutes may be used to promote intermetallic formation and deformation of the M5 metal prior to dielectric deposition. It is believed that the temperature at which subsequent dielectric deposition is performed is high enough to cause aluminum grain growth, and thus, by performing a pre-deposition anneal process, film deformation and grain growth is promoted prior to deposition, resulting in a higher quality surface upon which to deposit the dielectric. Cracks and other surface deformations in the resulting dielectric layer are typically avoided as a result of the annealing process.

Next, in block 74 (FIG. 5) a high dielectric constant film (e.g., tantalum pentoxide in the illustrated implementation) is deposited as the capacitor insulator layer, typically with a thickness of less than about 50 nm, e.g., with a thickness of about 40 nm. Various deposition technologies may be used, including both physical and chemical vapor deposition, typically depending upon the type of dielectric material being deposited. For tantalum pentoxide, for example, a Metal Organic Chemical Vapor Deposition (MOCVD) process may be used, e.g., using a Eureka 2000 MOCVD cluster tool available from Jusung Engineering Company, Ltd., which incorporates a gas boundary layer in the reactor to improve film uniformity, and which includes multiple modules capable of performing both the deposition process and a post-deposition plasma anneal. Incoming gases may be preheated to maintain process temperature stability.

Various deposition control parameters may be used. For example, deposition of tantalum pentoxide may be performed at about 430° C. using tantalum pentaethoxide [TAETO, Ta(OCH$_2$CH$_3$)$_5$] and oxygen, with the TAETO supplied to the reactor by a single or multiple vaporizer delivery system at about 40 mg/min for each vaporizer, with an oxygen flow rate of about 10 sccm or higher and at about 0.4 Torr up to about 10 Torr.

Next, in block 76 (FIG. 5), and within the same MOCVD tool, the dielectric layer is plasma annealed, e.g., using an oxygen anneal performed at about 430° C. with about 200 sccm of oxygen at about 0.4 Torr or higher, for about 60 seconds at about 300 Watts RF power. Doing so typically reduces the dielectric carbon content and more fully oxidizes the dielectric layer. In some embodiments, annealing may not be required, while in others, other anneal processes, using other process parameters, may be used in the alternative.

Figure 6C:
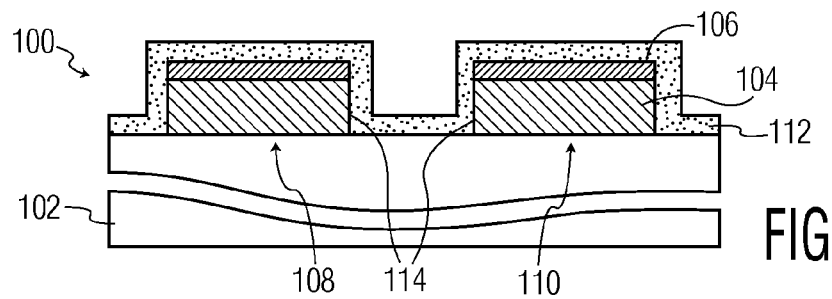

As shown in FIG. 6C, the deposition and annealing performed in blocks 74 and 76 (FIG. 5) result in the deposition of a dielectric layer 112, oriented both on top of the TiN layer 106 and on sidewalls 114 of the patterned M5 stack features, as well as on top of the interlayer dielectric (ILD) upon which the M5 stack is deposited. It is to be noted that MOCVD deposition is typically very conformal, whereby the thickness of the dielectric on the sidewalls of the M5 bottom electrodes will typically be nearly the same to the thickness deposited on the top M5 ARC layer.

Next, in block 78 (FIG. 5), a layer of TiN is deposited over the dielectric layer deposited in block 74, for use as the top electrode of the MIM capacitor structure. Deposition may occur using various techniques, including both PVD and CVD techniques, e.g., via reactive sputtering at about 12 kW and about 200° C., using a titanium sputter target with a purity of about 99.995%, and with wafer bias of about 100 Watts used to achieve a film resistivity of about 80 μΩcm. The deposited thickness of the TiN film may vary as discussed above; however, in the illustrated embodiment, a thickness of about 3000 angstroms may be used.

Figure 6D:
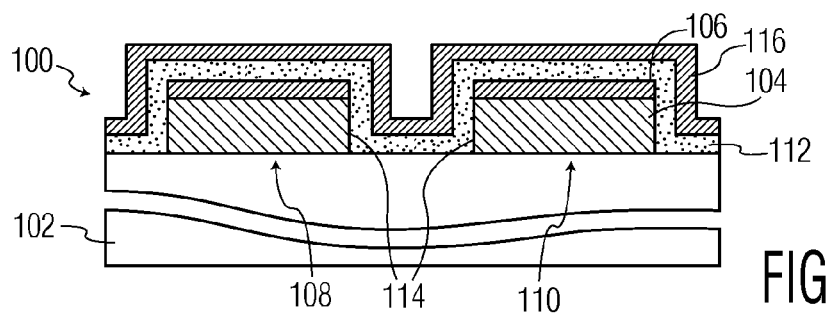

As shown in FIG. 6D, the conductive material deposition performed in block 78 (FIG. 5) results in the deposition of a TiN layer 116, oriented over the dielectric layer 112, thus resulting in a profile that coats the top of each leg and sidewall of the capacitive structure, as well as on top of the interlayer dielectric (ILD) upon which the M5 stack is deposited, but separated therefrom by the dielectric layer 112.

Next, in block 80 (FIG. 5), the MIM capacitor structure is defined by photolithography, i.e., the dielectric and TiN layers are patterned to form the top electrode and insulator layers for the capacitor, as well as the sidewall spacers discussed above. Typically, the dielectric and TiN layers are patterned using the same photoresist mask. As such, from a processing standpoint, fabrication of a MIM capacitor structure in the herein-described process only adds one patterning step to the conventional integrated circuit fabrication process.

Figure 6E:
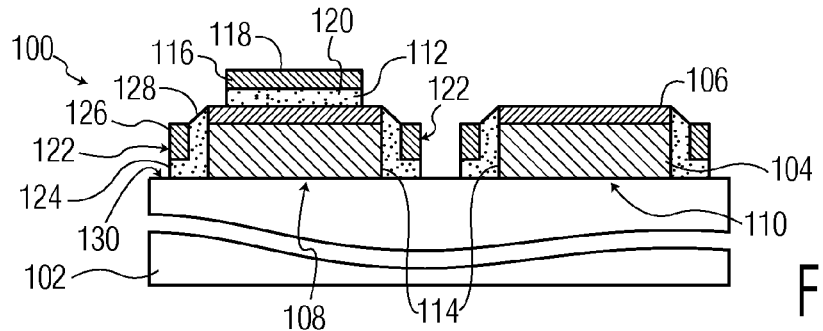

As shown in FIG. 6E, by patterning the dielectric layer 112 and TiN layer 116, a top electrode 118 and insulator layer 120 are formed for the MIM capacitor structure, with the insulator layer 120 interposed between the top electrode 118 and the previously-formed bottom electrode 108. Moreover, for bonding pad 110, layers 112 and 116 are removed via the patterning operation to expose the surface of TiN layer 106.

In addition, in the illustrated embodiment, it is desirable to oversize the bottom electrode 108 relative to the top electrode 118 and insulator layer 120 of the MIM capacitor structure, which sets the allowable misalignment between the layers of the device, i.e., the top and bottom electrodes. Therefore, the pattern for the TiN/dielectric etch is typically configured to expose a perimeter of about 1 µm around the top surface of bottom electrode 108.

Also, the patterning performed in block 80 (FIG. 5) also results in formation of the sidewall spacers within the channels of the MIM capacitor structure. In particular, FIG. 6E illustrates sidewall spacers 122, having an insulator layer 124 that is interposed between the sidewalls 114 of the bottom electrode 108 and a conductive layer 126. Of note, the dielectric layer 112 is etched anisotropically to form the planar capacitor dielectric 128, and as a result, the conductive layer 126 in each sidewall spacer 122 is physically separated from the top electrode 118.

Figure 7:
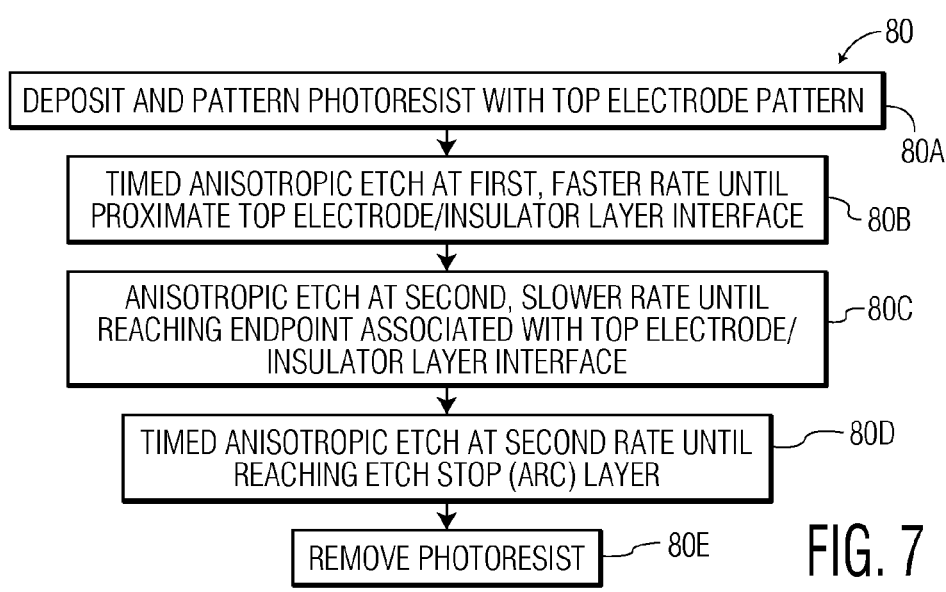
FIG. 7 is a flowchart illustrating a process for implementing the insulator and TiN layer etching step referenced in FIG. 5.

One manner of implementing the etch of the dielectric and TiN layers referenced in block 80 of FIG. 5 is illustrated in greater detail in FIG. 7, which utilizes a multi-rate etching process to etch both layers, while avoiding exposure of the aluminum in the M5 layer to the etching chemistry. In this implementation, a $BCl_3/Cl_2$ etching chemistry is used, and the etch is controlled to stop in the TiN ARC film that coats the M5 layer and forms the bottom electrode. As such, in this context the TiN ARC film acts as an etch stop layer for the top electrode/insulator layer etch.

Specifically, in block 80A of FIG. 7, conventional photoresist deposition, exposure and development is utilized to pattern an appropriate photoresist mask for patterning the top electrode and underlying insulator layer for the MIM capacitor structure. Next, in blocks 80B, 80C and 80D, a three step anisotropic etch is performed through the photoresist mask, using an etching chemistry of $BCl_3/Cl_2$. Other selective or non selective etching chemistries, including $BCl_3$, $Cl_2$, $CHF_3$, $SF_6$ or combinations thereof, may be used in the alternative. Also, as shown in block 80E, once the anisotropic etch is performed, the photoresist mask is removed in a manner well known in the art.

In this multi-step of the anisotropic etch, a first, faster etching rate of about 300-400 nm/minute is obtained, by performing the etch with a total flow of about 100-200 sccms, a pressure of about 10 mTorr-20 mTorr, a source power of about 350-700 Watts, and a bias power of about 150-230 Watts. Then, the etching rate is lowered to a second, slower etching rate of about 50-100 nm/min, by modifying the total flow to about 100-150 sccms, the pressure to about 8-10 mTorr, the source power to about 200-500 Watts, and the bias power to about 160-180 Watts.

In various embodiments of the invention, switching from the faster rate to the slower rate may occur either at a predetermined set point or after a predetermined exposure time. For example, reaching the interface between the TiN and insulator layers may sufficiently alter the plasma composition in the etching chamber to define a set point that can be used to trigger the slow down in the etching rate, or empirical analysis can be used to select an appropriate time delay before triggering the slow down for a particular MIM capacitor design. Likewise, for termination of the etching process, a set point associated with exposure of the TiN ARC film, or an empirically-derived time delay, may be used.

In the illustrated embodiment, a three step etching process is performed. The first step is performed at the faster rate until the etching process reaches a point proximate the interface between the TiN and dielectric layers (e.g., within about 30% of the TiN layer to the interface), then the etching process variables are altered as described above to perform a slower etch until the etching process reaches a point proximate the etch stop layer, here the TiN ARC deposited on the bottom electrode. In the illustrated embodiment, for example, the first step comprises a timed etch that is used to etch through about 70% of the TiN layer, leaving about 30% of the TiN layer remaining to the interface with the dielectric layer. It will be appreciated, however, that in other embodiments the switch from the faster rate to the slower rate can occur upon or after reaching the interface between the TiN and insulator layers.

Upon switching to the slower rate, a controlled etch is performed in a second step until reaching an endpoint associated with the interface—i.e., an endpoint associated with the detection of the removal of a sufficient quantity of TiN and the exposure of the tantalum pentoxide. The TiN removal can be determined, for example, by optical emission endpoint detection using a 703 nm filter. It will be appreciated that another wavelength can be used to detect the endpoint given the chemistries used.

Once the endpoint is reached, another timed etch is performed in a third step until reaching the point proximate the etch stop layer, e.g., to a point at which etching has occurred into the etch stop layer a distance of about 0 to 250 angstroms. The time of the last timed etch may be calculated, for example, from the elapsed time from the start of the low rate etch until the endpoint is reached, e.g., by selecting a time that is about 30% of this elapsed time.

It will also be appreciated that, in the context of the multirate etching process, different materials may be used as an etch stop layer over the top electrode, including, for example, any conductive film that is thin enough to absorb and reduce the reflectance of the exposure wavelength (whether I-line, g-line or DUV), e.g., Ti, Ta, W, Mo, and their silicides. Any other material that prevents exposure of aluminum in the M5 layer to chlorine etching chemistry, and that is suitable for use in the bottom electrode of the MIM capacitor structure, may be used in the alternative.

By utilizing a multi-rate etching process, exposure of the electrode to chlorine etching chemistries is avoided. One principal advantage is thus the prevention of corrosion to the lower electrode by chlorine containing compounds. However, it will be appreciated that other patterning and etching processes may be used in the alternative in other applications.

Returning to FIG. 5, subsequent to patterning the MIM capacitor structure, an interlayer dielectric (ILD) layer is deposited in block 82. For example, a high density plasma chemical vapor deposition (HDP-CVD) may be used to gap fill the M5 pattern with a dielectric material (e.g., SiO2). Other dielectric deposition techniques may also be used. One desirable method, for example, adds a final coat of tetra-ethyl-ortho-silicate (TEOS)-based oxide, which produces a TEOS-based film that typically has a higher deposition rate than the HDP-CVD process, and is thus more economical. Also, such materials typically strengthen the interconnect structure to better withstand the forces of wire bonding to the bond pads. It may also be desirable to maintain the wafer temperature during the HDP-CVD process to about 400±10° C. to reduce mechanical stress.

Figure 6F:
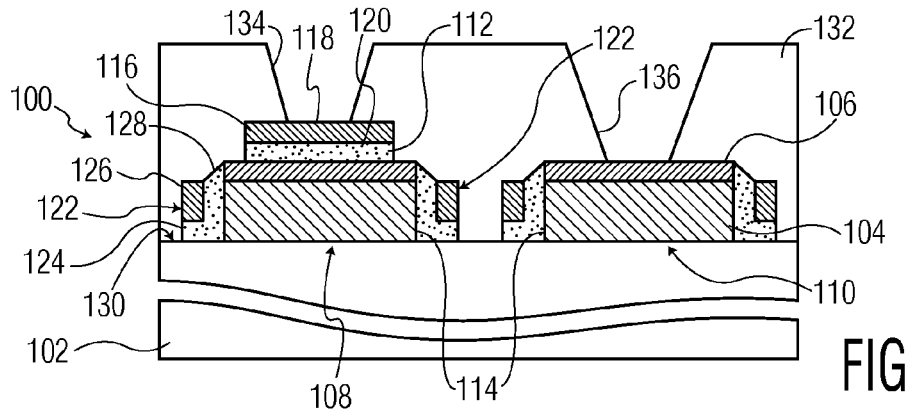

Next, in block 84 (FIG. 5), the ILD layer is planarized using chemical mechanical polishing (CMP), and in block 86 (FIG. 5), the ILD layer is patterned to form the M5 vias (V5), using conventional photolithography and etch techniques. Vias are typically provided to interconnect bonding pads, as well as the top electrode of the MIM capacitor structure, with the M6 layer. Thus, as shown in FIG. 6F, subsequent to deposition, planarization and patterning in blocks 82-86 (FIG. 5), an ILD layer 132 is formed, including vias 134 and 136 that respectively interconnect M6 with the top electrode 118 and bonding pad 110.

As discussed above, various arrays, sizes and spacings of vias may be used to interconnect the top electrode of a MIM capacitor structure to the next conductive layer in an integrated circuit. In the alternative, the top electrode could be coupled to an intermediate conductive path, and routed to either of M5 or M6 therefrom.

Next, in block 88 (FIG. 5), the vias are filled, e.g., by depositing tungsten plugs in the vias through the deposition of a Ti/TiN bilayer using PVD or CVD, deposition of tungsten using CVD and CMP planarization. In the alternative, other conductive materials may be used to fill the vias, e.g., aluminum, copper, or alloys thereof.

Figure 6G:
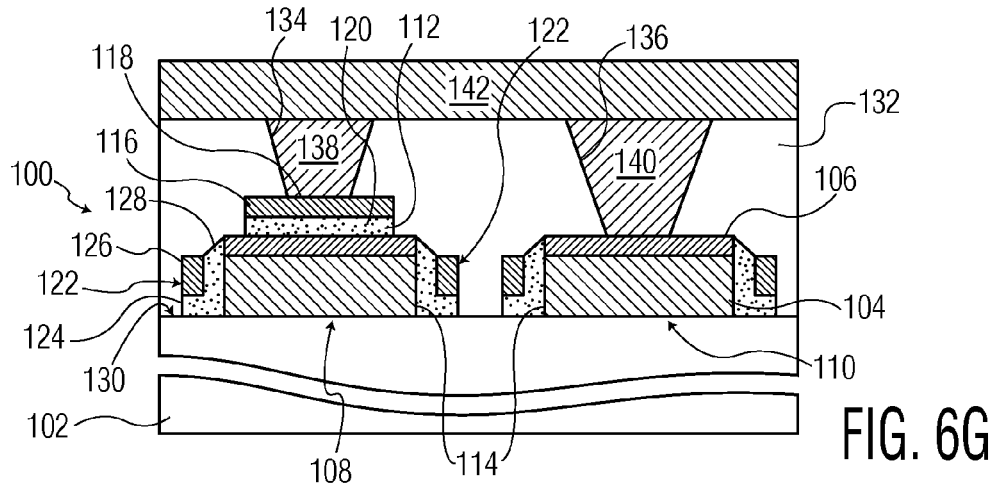

Next, in block 90 (FIG. 5), the M6 layer is deposited and patterned, using conventional deposition and photolithography techniques. For example, an Al—Cu/TiN stack may be deposited for the M6 layer. Thus, as shown in FIG. 6G, subsequent to deposition and patterning of the plugs and M6 layer in blocks 88-90 (FIG. 5), plugs 138 and 140 are formed in vias 134 and 136 to respectively interconnect an M6 layer 142 with the top electrode 118 and bonding pad 110.

Subsequent to deposition and patterning of M6, conventional fabrication steps are performed to complete the integrated circuit, as shown in block 92 of FIG. 5. Various operations may be performed, e.g., PSG/nitride passivation of the M6 level (at about 500 and about 600 nm, respectively) prior to bond pad mask and etch, and an $H_2/N_2$ alloy treatment at about 420° C. for about 30 minutes may be performed before electrical testing.

As a result of the aforementioned process and design, MIM capacitor structures having capacitance densities at or above 23 $fF/\mu m^2$ can be obtained, thereby offering a substantial improvement over conventional designs, where capacitance densities exceeding 1 $fF/\mu m^2$ (more than an order of magnitude lower) are difficult to achieve. Moreover, it has been found that appropriate leakage current density characteristics, as well as appropriate temperature and voltage linearity characteristics, can be obtained, while using a fabrication process that is compatible with other conventional integrated circuit fabrication processes, and that typically adds only one additional patterning step to the process. Furthermore, it is believed that through decreasing the surface roughness of the top and/or bottom electrodes (e.g., through the aforementioned annealing and ammonia plasma treatment operations), superior capacitance characteristics may be obtained due to improved characteristics in the insulator layer of the MIM capacitor structure.

Various modifications may be made to the illustrated embodiments without departing from the spirit and scope of the invention. For example, it may be desirable in some applications to deposit TiN or other conductive materials on the sidewalls of the Al—Cu portion of the bottom electrode. Moreover, it may be desirable to pattern the sidewall spacers separately from the top electrode and insulator layer of the MIM capacitor structure, which would permit, among other benefits, the ability to remove the sidewall spacers from non-essential areas, e.g., in other areas of the M5 layer (e.g., bonding pad 110 shown in FIG. 6G). It may also be desirable to deposit the materials in the sidewall spacers in separate steps, which would permit, among other benefits, different materials, dimensions and layouts to be used for the sidewall spacers.

Additional modifications will become apparent to one of ordinary skill in the art. Therefore, the invention lies in the claims hereinafter appended.

WORKING EXAMPLES

Ammonia Plasma Treatment

Figure 8:
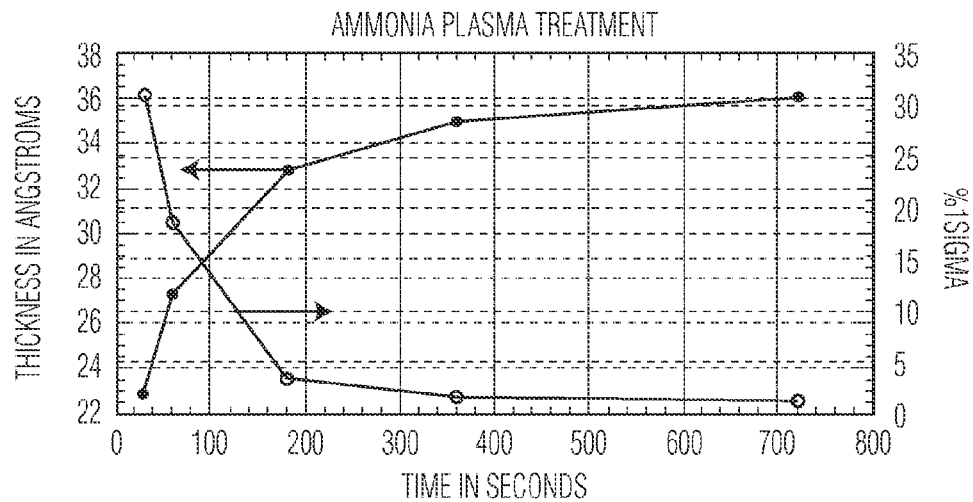
FIG. 8 is a graph illustrating silicon nitride growth on test wafers as a result of ammonia plasma treatment.

As discussed above, an ammonia plasma treatment may be introduced to prevent oxidation of a TiN lower electrode after M5 deposition. The process described above was tested by processing bare silicon 200-mm test wafers with different treatment times. A thin silicon nitride film was measured after the ammonia treatment. FIG. 8 illustrates the resulting silicon nitride growth on the test wafers.

The data was taken from a 49-point measurement with a 3 mm edge exclusion measured by an Optiprobe model 5240, a tool available from Therma-wave Corporation that uses spectral ellipsometry and fine angle reflectometry to measure stacks of thin transparent films. The 180 second treatment time was noted as providing an acceptable compromise between processing time and the uniformity of silicon nitride.

Ammonia plasma treatment was also found to alter voltage linearity. For test samples constructed using the aforementioned process, when varying the voltage from −5 to +5 V, the following results were obtained:

| $NH_3$ treatment | VC1 (ppm/V) | VC2 (ppb/$V^2$) |
| --- | --- | --- |
| No | 827 | 27 |
| Yes | 692 | 40 |

The temperature coefficient, however, was not found to be significantly affected by ammonia plasma treatment, e.g., when the temperature was varied over a range of −50 to 150° C.

Sidewall Height

Figure 9:
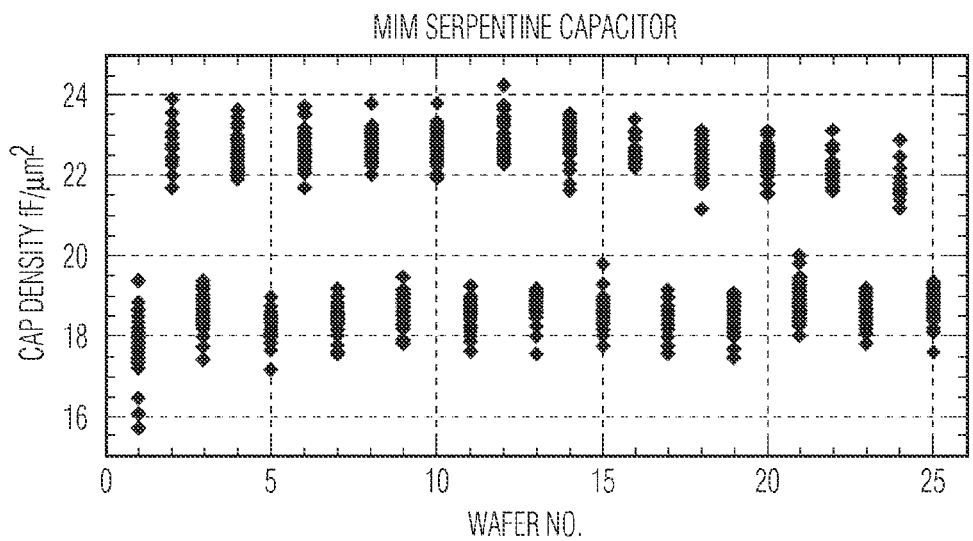
FIG. 9 is a graph illustrating capacitance density of test wafers, contrasting the capacitance densities obtained using 1 μm and 2 μm M5 layer thicknesses.

As discussed above, the thickness of the M5 layer, and thus the height of the resulting sidewall along each leg of the bottom electrode, affects the lateral capacitance effects provided by the sidewall spacers. Twenty five test wafers were fabricated with odd numbered wafers having an M5 layer thickness of about 1 μm, and the even numbered wafers having an M5 layer thickness of about 2 μm, with all other processing variables and dimensions being the same. The resulting capacitance densities observed are illustrated in FIG. 9, and it can be seen that an improvement of about 5 fF/μm² was obtained due to the doubling of the thickness of the M5 layer.

What is claimed is:

1. A method of fabricating a metal-insulator-metal (MIM) capacitor structure in an integrated circuit, the method comprising:
    ammonia plasma treating a surface of a bottom electrode of the MIM capacitor structure;
    depositing an insulator layer over the plasma treated bottom electrode to improve a surface barrier characteristic to oxygen;
    depositing a conductive layer over the deposited insulator layer; and
    etching the deposited conductive layer and the deposited insulator layer to define a top electrode and a sidewall spacer, wherein the top electrode and a conductive layer in the sidewall spacer are physically separated.

2. The method of claim 1, wherein the insulator layer comprises tantalum pentoxide.

3. The method of claim 1, wherein the ammonia plasma treating further comprises:
    bombarding the titanium nitride surface with nitrogen ions to inhibit oxidation of the titanium nitride surface.

4. The method of claim 3, wherein the nitrogen ions stuff columnar grain boundaries in the titanium nitride surface.

5. The method of claim 1, wherein the ammonia plasma treating is performed in a plasma enhanced chemical vapor deposition tool.

6. The method of claim 5, wherein the ammonia plasma treating is performed in an atmosphere comprising ammonia and an inert gas.

7. The method of claim 6, wherein the ammonia plasma treating is performed in an atmosphere having a pressure of about 10 milliTorr to about 10 Torr and a bottom electrode temperature of about 300 to about 500° C.

8. The method of claim 6, wherein the inert gas is nitrogen (N₂).

9. The method of claim 6, wherein the inert gas is argon (Ar).

10. The method of claim 5, wherein the ammonia plasma treating includes applying RF power including up to about 50% low frequency RF power.

11. The method of claim 1, wherein the insulator layer has a thickness of about 40 nm.

12. The method of claim 1, wherein the ammonia plasma treating alters voltage linearity of the MIM capacitor structure.

13. A metal-insulator-metal (MIM) capacitor structure for use in an integrated circuit, the MIM capacitor structure comprising:
    top and bottom electrodes, wherein the bottom electrode includes an ammonia plasma treated surface;
    an insulator layer interposed between the top electrode and the ammonia plasma treated surface of the bottom electrode; and
    a sidewall spacer having a conductive layer that is physically separated from the top electrode and deposited over the insulator layer.

14. The MIM capacitor structure of claim 13, wherein the ammonia plasma treated surface comprises titanium nitride.

15. The MIM capacitor structure of claim 14, wherein the insulator layer comprises tantalum pentoxide.

16. The MIM capacitor structure of claim 14, wherein the ammonia plasma treated surface is substantially free of titanium oxide as a result of bombardment of the ammonia plasma treated surface with nitrogen ions.

17. The MIM capacitor structure of claim 13, further comprising:
    a barrier layer over the ammonia plasma treated surface.

18. The MIM capacitor structure of claim 17, wherein the barrier layer comprises ruthenium (Ru).

19. The MIM capacitor structure of claim 13, wherein the sidewall spacer increases a fringe component of capacitance.

20. The MIM capacitor structure of claim 13, wherein the sidewall spacer increases a lateral component of capacitance.

21. A metal-insulator-metal (MIM) capacitor structure for use in an integrated circuit, the MIM capacitor structure comprising:
    top and bottom electrodes, wherein the bottom electrode includes an ammonia plasma treated surface;
    an insulator layer interposed between the top electrode and the ammonia plasma treated surface of the bottom electrode; and
    a sidewall spacer having a conductive layer that is physically separated from both the top electrode and the bottom electrode.

* * * * *